United States Patent
Liu

(10) Patent No.: US 11,574,913 B1
(45) Date of Patent: Feb. 7, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Xiang Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/664,906

(22) Filed: May 25, 2022

Related U.S. Application Data

(63) Continuation of application No. PCT/CN2022/070379, filed on Jan. 5, 2022.

(30) Foreign Application Priority Data

Oct. 25, 2021 (CN) .......................... 202111242748.9

(51) Int. Cl.
  *H01L 27/108* (2006.01)
(52) U.S. Cl.
  CPC .. *H01L 27/10823* (2013.01); *H01L 27/10876* (2013.01)
(58) Field of Classification Search
  None
  See application file for complete search history.

(56) References Cited

U.S. PATENT DOCUMENTS

2009/0207667 A1* 8/2009 Park .................. G11C 8/14
  257/326

FOREIGN PATENT DOCUMENTS

| CN | 106783743 A | 5/2017 |
| CN | 208903993 U | 5/2019 |
| CN | 110957318 A | 4/2020 |
| CN | 110970346 A | 4/2020 |
| KR | 20010091733 A | 10/2001 |

OTHER PUBLICATIONS

International Search Report & Written Opinion cited in PCT/CN2022/070379 dated Apr. 28, 2022, 16 pages.

* cited by examiner

*Primary Examiner* — Hsien Ming Lee
(74) *Attorney, Agent, or Firm* — Cooper Legal Group, LLC

(57) ABSTRACT

The present disclosure relates to the technical field of semiconductors, and provides a semiconductor structure and a manufacturing method thereof. The semiconductor structure includes: a substrate; an isolation structure, formed in the substrate; a word line (WL), a part of the WL being located in the isolation structure; and a conductive portion, located at a bottom of the isolation structure.

19 Claims, 14 Drawing Sheets

SEMICONDUCTOR STRUCTURE AND MANUFACTURING METHOD THEREOF

CROSS-REFERENCE TO RELATED APPLICATIONS

This is a continuation of International Application No. PCT/CN2022/070379, filed on Jan. 5, 2022, which claims the priority to Chinese Patent Application No. 202111242748.9, titled "SEMICONDUCTOR STRUCTURE AND MANUFACTURING METHOD THEREOF" and filed on Oct. 25, 2021. The entire contents of International Application No. PCT/CN2022/070379 and Chinese Patent Application No. 202111242748.9 are incorporated herein by reference.

TECHNICAL FIELD

The present disclosure relates to the technical field of semiconductors, and in particular to a semiconductor structure and a manufacturing method thereof.

BACKGROUND

With miniaturization of the dynamic random access memory (DRAM), there is an increasingly small transistor size in the storage region to cause serious current leakage and to affect performance of the device.

SUMMARY

The present disclosure provides a semiconductor structure and a manufacturing method thereof.

According to a first aspect, the present disclosure provides a semiconductor structure, including:
  a substrate;
  an isolation structure, formed in the substrate;
  a word line (WL), a part of the WL being located in the isolation structure; and
  a conductive portion, located at a bottom of the isolation structure.

According to a second aspect, the present disclosure provides a method of manufacturing a semiconductor structure, including:
  providing a substrate;
  forming a trench in the substrate;
  forming an isolation structure in the trench, and forming a conductive portion at a bottom of the isolation structure;
  forming a WL trench in the isolation structure; and
  forming a WL in the WL trench.

DETAILED DESCRIPTION

Figure 1:
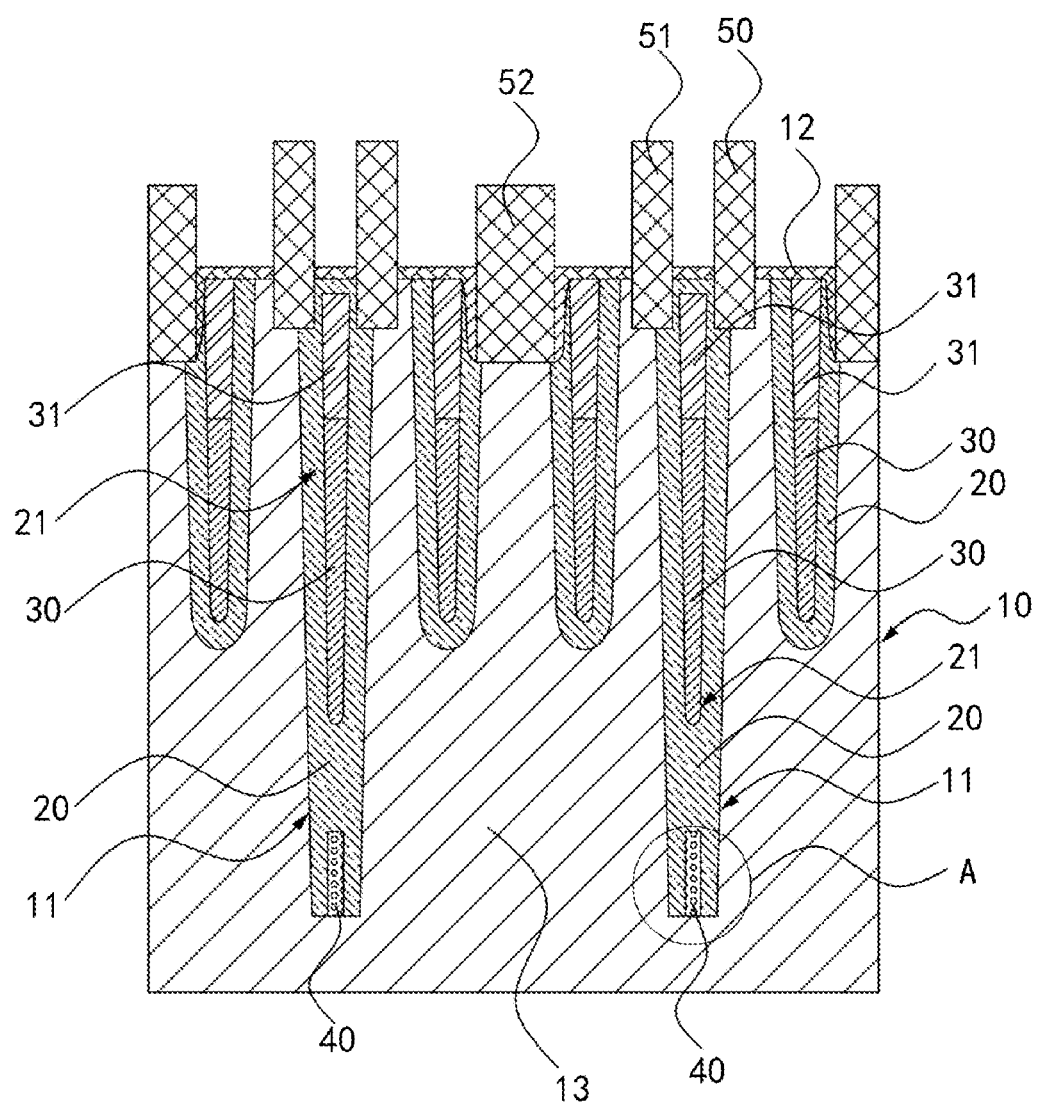
FIG. 1 is a schematic structural view of a semiconductor structure according to an exemplary implementation.

The typical embodiments embodying the features and advantages of the present disclosure are described in detail below. It should be understood that the present disclosure may have various changes in different embodiments, which do not depart from the scope of the present disclosure. The description and accompanying drawings herein are essentially used for the purpose of explanation, rather than limiting the present disclosure.

Different exemplary implementations of the present disclosure are described below with reference to the accompanying drawings. The accompanying drawings form a part of the present disclosure, which show by way of example different exemplary structures, systems, and steps that can implement various aspects of the present disclosure. It should be understood that other specific solutions of components, structures, exemplary apparatuses, systems, and steps may be used, and structural and functional modifications may be made without departing from the scope of the present disclosure. Moreover, although the terms such as "above", "between", and "within" may be used in this specification to describe different exemplary features and elements of the present disclosure, these terms are used herein only for convenience of description, for example, according to the directions of the examples in the accompanying drawings. Nothing in this specification should be understood as requiring a specific three-dimensional direction of the structure to fall within the scope of the present disclosure.

An embodiment of the present disclosure provides a semiconductor structure. Referring to FIG. 1 to FIG. 4, the semiconductor structure includes: a substrate 10; an isolation structure 20, formed in the substrate 10; a WL 30, a part of the WL 30 being located in the isolation structure 20; and a conductive portion 40, located at a bottom of the isolation structure 20, and configured to repel electrons.

The semiconductor structure provided by the embodiment of the present disclosure includes the substrate 10, the isolation structure 20, the WL 30 and the conductive portion 40. With the conductive portion 40 at the bottom of the isolation structure 20, when the WL 30 is activated, the conductive portion 40 at the bottom of the isolation structure 20 repels surface electrons to block the leakage path, thereby preventing the electric leakage of the semiconductor structure and improving the performance of the semiconductor structure.

It is to be noted that when the WL 30 is activated, the electrons are adsorbed by an electric field to the WL 30 and the surface of the isolation structure 20. In the related art, the isolation structure 20 is made deep enough to prevent conduction of electrons at two sides of the isolation structure 20. In the embodiment, with the conductive portion 40 at the bottom of the isolation structure 20, the conductive portion 40 repels neighboring electrons to prevent the conduction of electrons at two sides of the isolation structure 20. Therefore, the depth of the isolation structure 20 can be decreased appropriately in the embodiment. Certainly, when the isolation structure 20 is deep enough, the leakage path can be better blocked in combination with the conductive portion 40 at the bottom of the isolation structure 20.

In an embodiment, the substrate 10 may be a p-type silicon substrate, an n-type silicon substrate, a silicon-germanium substrate, etc.

In an embodiment, the conductive portion 40 contacts the substrate 10 to implement electrical connection between the conductive portion 40 and the substrate 10. When the WL 30 is activated, the conductive portion 40 can repel the neighboring electrons to block the leakage path.

In an embodiment, both the conductive portion 40 and the substrate 10 have a negative voltage, and negative electrons are adsorbed to the WL 30 and the surface of the isolation structure 20. The conductive portion 40 and the substrate 10 can repel the neighboring electrons to prevent the conduction of electrons at two sides of the isolation structure 20 and block the leakage path.

Figure 2:
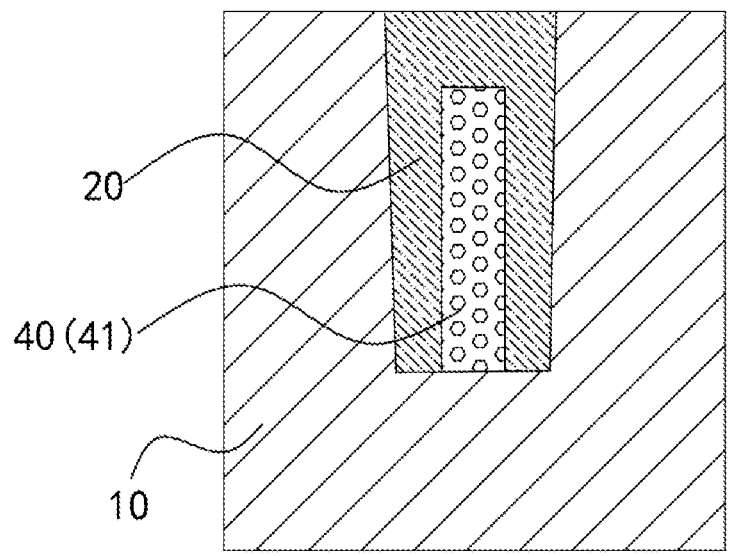
FIG. 2 is an enlarged schematic structural view at A in FIG. 1.

In an embodiment, as shown in FIG. 2, the conductive portion 40 includes: a first conductive layer 41. With a part located in the isolation structure 20, the first conductive layer 41 is electrically connected to the substrate 10, ensuring that the conductive portion 40 has the negative voltage to repel the neighboring negative electrons, preventing the conduction of electrons at two sides of the isolation structure 20 and blocking the leakage path.

In an embodiment, as shown in FIG. 1 and FIG. 2, the first conductive layer 41 contacts the substrate 10, namely the conductive portion 40 may only include the first conductive layer 41. The first conductive layer 41 may be directly formed on the substrate 10 to implement contact between the first conductive layer 41 and the substrate 10, ensuring that both the conductive portion 40 and the substrate 10 have the negative voltage to repel the neighboring negative electrons, preventing the conduction of electrons at two sides of the isolation structure 20 and blocking the leakage path. In the embodiment, a material of the first conductive layer 41 includes polycrystalline silicon. By directly forming the polycrystalline silicon on the substrate 10, not only both the conductive portion 40 and the substrate 10 have the negative voltage, but the polycrystalline silicon can also be formed on the substrate 10 conveniently. The first conductive layer 41 may be 20-30 nm high. In some embodiments, the material of the first conductive layer 41 may be a metal material, such as tungsten (W), tungsten nitride (WN), titanium (Ti), titanium nitride (TiN), molybdenum (Mo), cobalt (Co), nickel (Ni), copper (Cu) or aluminum (Al).

It is to be noted that a bottom end of the first conductive layer 41 may be flush with a bottom end of the isolation structure 20, such that the first conductive layer 41 may be directly formed in the trench 11 of the substrate 10. Or, the bottom end of the first conductive layer 41 may be lower than the bottom end of the isolation structure 20, namely the bottom of the first conductive layer 41 is located in the substrate 10 by forming a recess in a bottom wall of the trench 11 and forming the bottom of the first conductive layer 41 in the recess.

Figure 3:
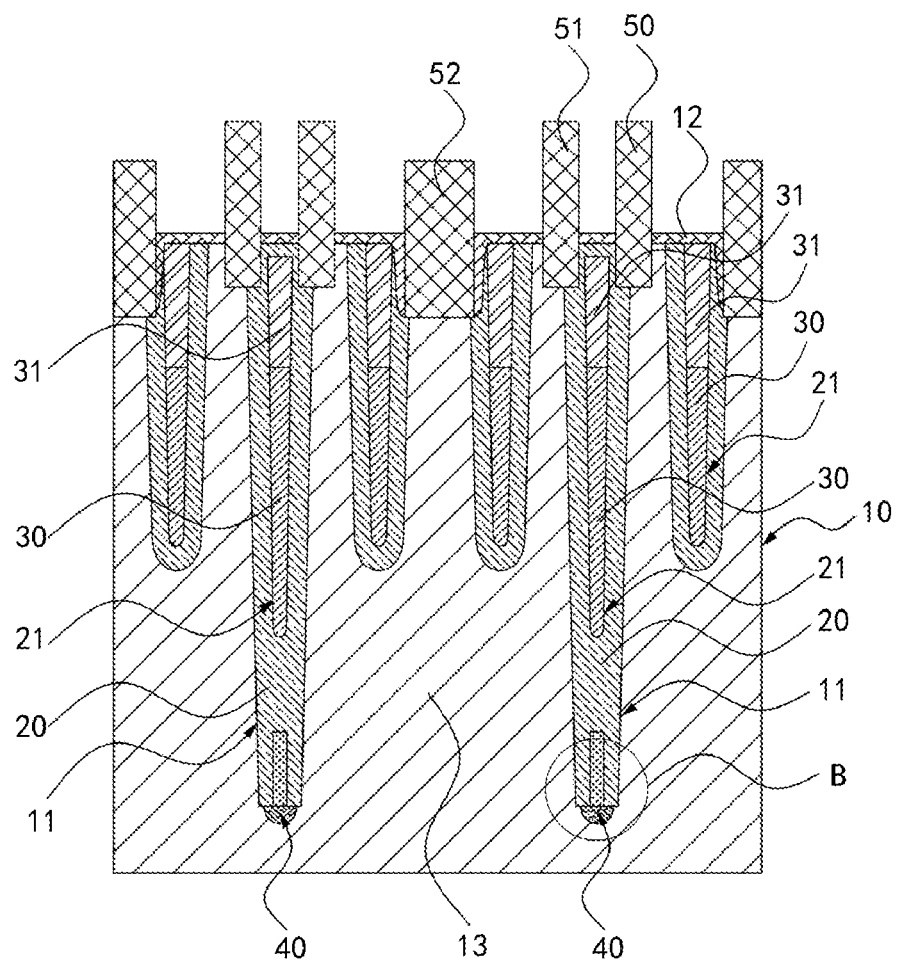
FIG. 3 is a schematic structural view of a semiconductor structure according to another exemplary implementation.
Figure 4:
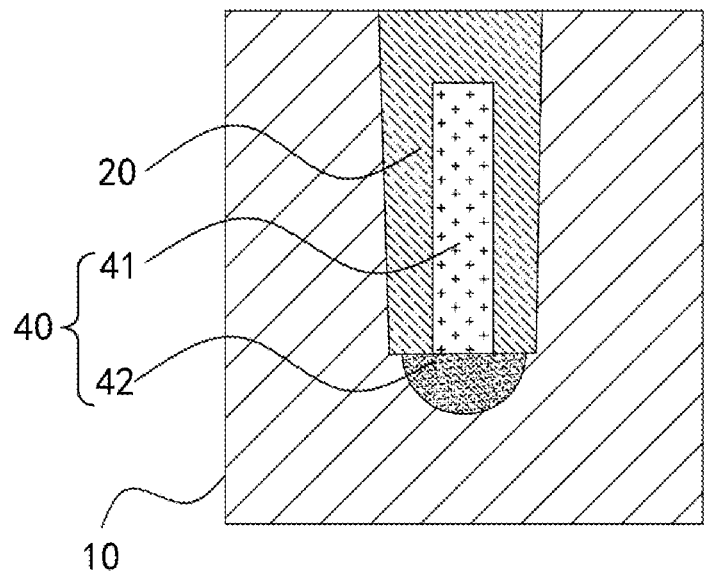
FIG. 4 is an enlarged schematic structural view at B in FIG. 3.

In an embodiment, the conductive portion 40 further includes: a second conductive layer 42. The second conductive layer 42 contacts the substrate 10. The first conductive layer 41 is located on an upper surface of the second conductive layer 42 to implement contact between the first conductive layer 41 and the second conductive layer 42. As shown in FIG. 3 and FIG. 4, the conductive portion 40 includes a first conductive layer 41 and a second conductive layer 42. The second conductive layer 42 is located in the substrate 10, and electrically connected to the substrate 10, and the first conductive layer 41 is electrically connected to the substrate 10 through the second conductive layer 42, such that both the conductive portion 40 and the substrate 10 have the negative voltage and can repel the neighboring negative electrons, thereby preventing the conduction of electrons at two sides of the isolation structure 20 and blocking the leakage path.

In an embodiment, a bottom of the first conductive layer 41 is located in the second conductive layer 42 to implement more stable conduction between the first conductive layer 41 and the second conductive layer 42.

In an embodiment, a bottom end of the first conductive layer 41 abuts against a top end of the second conductive layer 42.

In an embodiment, a material of the first conductive layer 41 includes a metal material, while a material of the second conductive layer 42 includes metal silicide. The first conductive layer 41 is electrically connected to the substrate 10, and the second conductive layer 42 may be formed in the substrate 10. The first conductive layer 41 may be 20-30 nm high, while the second conductive layer 42 may be 10-20 nm high.

In some embodiments, the metal material may include, but is not limited to: tungsten (W), tungsten nitride (WN), titanium (Ti), titanium nitride (TiN), molybdenum (Mo), cobalt (Co), nickel (Ni), copper (Cu) or aluminum (Al). The metal silicide may include, but is not limited to: at least one of nickel silicide, platinum silicide and cobalt silicide.

In an embodiment, the isolation structure 20 is a shallow trench isolation (STI) structure. By forming the conductive portion 40 in the STI structure, the isolation capability of the STI structure can be improved to prevent the electric leakage, and the depth of the STI structure can be decreased appropriately.

In an embodiment, as shown in FIG. 1, the semiconductor structure further includes: a first contact plug 50, and a second contact plug 51. The first contact plug 50 and the second contact plug 51 are located at two sides of the WL 30. Both the first contact plug 50 and the second contact plug 51 are a capacitance contact plug. The first contact plug 50 and the second contact plug 51 are configured to connect two capacitor structures. When the WL 30 is activated, the first contact plug 50 and the second contact plug 51 are connected to the electrons at two sides of the isolation structure 20. While the electrons at two sides of the isolation structure 20 are connected, the first contact plug 50 and the second contact plug 51 are also connected to cause the electric leakage between the two capacitor structures. In the embodiment, since the conductive portion 40 is formed at the bottom of the isolation structure 20 and the conductive portion 40 repels the neighboring electrons, the conduction of electrons at two sides of the isolation structure 20 can be blocked to prevent the electric leakage between the two capacitor structures.

It is to be noted that the semiconductor structure may further include a third contact plug 52, as shown in FIG. 1 and FIG. 3. There may be a plurality of the first contact plugs 50, a plurality of the second contact plugs 51 and a plurality of the third contact plugs 52, which is not limited herein and may be determined according to actual needs.

In an embodiment, the conductive portion 40 is located below the WL 30, and insulated from the WL 30. When the WL 30 is activated, the conductive portion 40 repels the neighboring electrons to prevent the conduction of electrons at two sides of the isolation structure 20.

In an embodiment, a height of the conductive portion 40 is less than a distance between the conductive portion 40 and the WL 30. That is, while the conductive portion 40 blocks the leakage path, the conductive portion 40 can be made as small as possible.

In an embodiment, as shown in FIG. 1 and FIG. 3, an isolation layer 31 is formed in the isolation structure 20. The isolation layer 31 is located on the WL 30. The isolation layer 31 can protect the WL 30. In an embodiment, the isolation layer 31 may include nitride or silicon oxide.

In an embodiment, as shown in FIG. 1 and FIG. 3, an insulating layer 12 is formed on an upper surface of the substrate 10 to cover the upper surface of the substrate 10. The isolation structure 20 in the substrate 10 is integrally formed, and thus an insulating material formed into the isolation structure 20 covers the upper surface of the substrate 10. The insulating layer 12 covers the insulating material. The insulating layer 12 may include nitride or silicon oxide.

In an embodiment, the WL 30 is a buried WL. A material of the WL 30 includes one or any combination of tungsten, titanium, nickel, aluminum, platinum, titanium nitride and other conductive materials. In some embodiments, an isolation layer 31 is further formed in a WL trench 21. The isolation layer 31 is located on the WL 30. The isolation layer 31 can protect the WL 30. Upon formation of the isolation layer 31, the isolation layer 31 may be planarized with dry etching or chemical mechanical polishing (CMP).

In an embodiment, an isolation structure 20 is formed in the substrate 10. The isolation structure 20 isolates a plurality of active regions 13. The WL 30 is located in the isolation structure 20 and in the active region 13. In some embodiments, the conductive portion 40 may be provided below the WL 30 in the isolation structure 20. In some embodiments, the conductive portion 40 may not be provided below one or more WLs 30 among a plurality of WLs 30 in the isolation structure 20. When two capacitance contact plugs (such as the first contact plug 50 and the second contact plug 51) are formed at two sides of the isolation structure 20, the conductive portion 40 is provided below the corresponding WL 30 in the isolation structure 20 to prevent the electric leakage between the two capacitor structures.

In an embodiment, the WL 30 may include a plurality of protrusive structures that may be located in the isolation structure 20 and the active region 13. The protrusive structures may have a same height, and may also have different heights.

Figure 5:
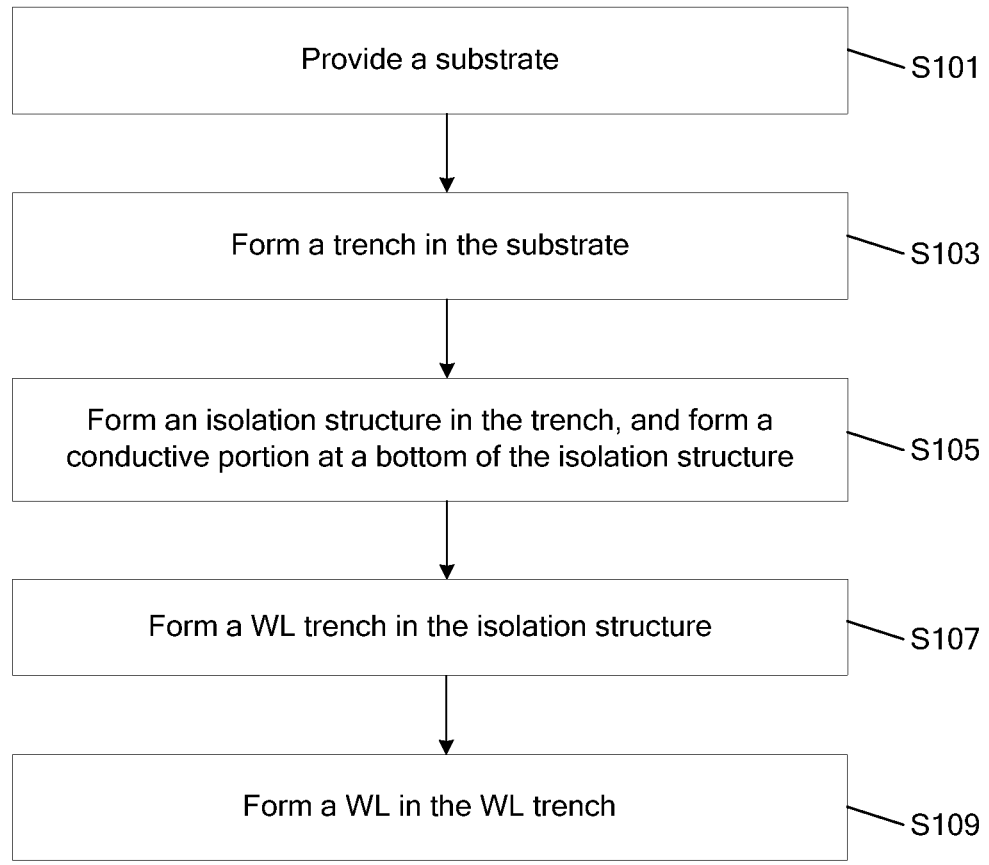
FIG. 5 is a schematic flowchart of a method of manufacturing a semiconductor structure according to an exemplary implementation.

An embodiment of the present disclosure further provides a method of manufacturing a semiconductor structure. As shown in FIG. 5, the method of manufacturing a semiconductor structure includes the following steps:

S101: Provide a substrate 10.
S103: Form a trench 11 in the substrate 10.
S105: Form an isolation structure 20 in the trench 11, and form, at a bottom of the isolation structure 20, a conductive portion 40 for repelling electrons.
S107: Form a WL trench 21 in the isolation structure 20.
S109: Form a WL 30 in the WL trench 21.

According to the method of manufacturing a semiconductor structure provided by the embodiment of the present disclosure, the trench 11 is formed in the substrate 10, the isolation structure 20 is formed in the trench 11, the conductive portion 40 is formed at the bottom of the isolation structure 20, and the WL 30 is formed in the WL trench 21 of the isolation structure 20. The conductive portion 40 at the bottom of the isolation structure 20 can repel surface electrons to block the leakage path, thereby preventing the electric leakage of the semiconductor structure and improving the performance of the semiconductor structure.

Figure 6:
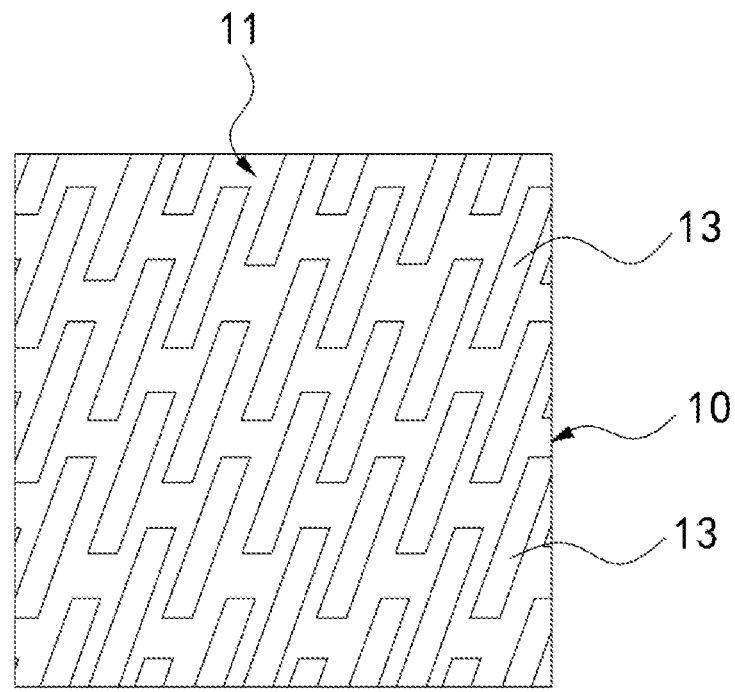
FIG. 6 is a top view of a trench formed in a method of manufacturing a semiconductor structure according to an exemplary implementation.
Figure 7:
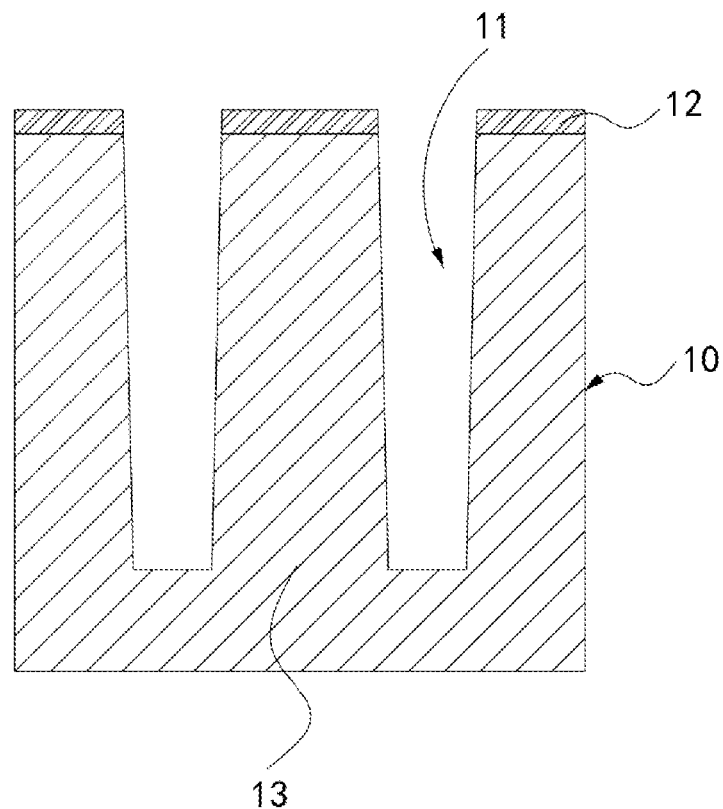
FIG. 7 is a schematic sectional view of a trench formed in a method of manufacturing a semiconductor structure according to an exemplary implementation.

In an embodiment, as shown in FIG. 6 and FIG. 7, the trench 11 is formed in the substrate 10, and a plurality of active regions 13 are isolated in the trench 11. The trench 11 may be formed by STI.

In an embodiment, an insulating layer 12 is formed on an upper surface of the substrate 10. During formation of the trench 11, a mask structure may cover the insulating layer 12, and a pattern corresponding to the trench 11 may be formed on the insulating layer 12, thereby etching a through hole in the insulating layer 12 and forming a recess in the substrate 10 to form the trench 11, as shown in FIG. 6 and FIG. 7.

In an embodiment, before a part of the conductive portion 40 is formed in the isolation structure 20, the conductive portion is formed in the trench 11 and contacts the substrate 10, which can ensure that both the conductive portion 40 and the substrate 10 has a negative voltage, and the conductive portion 40 and the substrate 10 repel neighboring electrons, thereby preventing the electron conduction at two sides of the isolation structure 20 and blocking the leakage path.

It is to be noted that the conductive portion 40 cannot be formed at the bottom of the isolation structure 20, unless the conductive portion 40 is formed before the isolation structure 20 is formed completely.

In an embodiment, a first conductive layer 41 is formed in the trench 11, the first conductive layer 41 serving as the conductive portion 40. Specifically, upon formation of the trench 11, the first conductive layer 41 may be formed at a bottom of the trench 11. The first conductive layer 41 may fill up the bottom of the trench 11. The first conductive layer 41 is etched to expose a bottom sidewall of the trench 11. The isolation structure 20 is filled in the trench 11 to cover the first conductive layer 41. Optionally, a part of the isolation structure 20 is filled in the trench 11, an opening is formed in the isolation structure to expose the substrate 10, and the first conductive layer 41 is formed in the opening. Thereafter, a remaining part of the isolation structure 20 is filled in the trench 11 to cover the first conductive layer 41.

In an embodiment, a second conductive layer 42 is formed in the substrate 10. A first conductive layer 41 is formed on the second conductive layer 42. A part of the first conductive layer 41 is formed in the trench 11. The first conductive layer 41 and the second conductive layer 42 serve as the conductive portion 40. Specifically, a recess may be formed in the substrate 10 through the trench 11. A second conductive layer 42 is formed in the recess. A first conductive layer 41 is formed at the bottom of the trench 11. The first conductive layer 41 may fill up the bottom of the trench 11. The first conductive layer 41 is etched to expose a bottom sidewall of the trench 11. The isolation structure 20 is filled in the trench 11 to cover the first conductive layer 41. Optionally, a recess may be formed in the substrate 10 through the trench 11. A second conductive layer 42 is formed in the recess. A part of the isolation structure 20 is filled in the trench 11, an opening is formed in the isolation structure to expose the second conductive layer 42, and the first conductive layer 41 is formed in the opening. Thereafter, a remaining part of the isolation structure 20 is filled in the trench 11 to cover the first conductive layer 41. Optionally, a metal material is deposited in the substrate 10 through the trench 11 and annealed to form the second conductive layer 42. The first conductive layer 41 may be formed according to the above two manners.

It is to be noted that by depositing the metal material in the substrate 10 provided with the trench 11, the metal material reacts with silicon in the substrate 10 to form the second conductive layer 42. The metal material may be deposited by physical vapor deposition (PVD), chemical vapor deposition (CVD) or atomic layer deposition (ALD). The metal material may include one or more of nickel, platinum, cobalt and so on. In some embodiments, upon deposition of the metal material in the substrate 10, annealing is performed to form the second conductive layer 42. The annealing may be high-temperature furnace tube propulsion, and may also be rapid thermal annealing (RTA) in the related art.

In an embodiment, the step of forming a conductive portion 40 includes: Form a first conductive layer 41 in the trench 11, the first conductive layer 41 serving as the conductive portion 40. A first insulating layer 22 is formed between the first conductive layer 41 and a sidewall of the trench 11 to ensure insulation between the first conductive layer 41 and the sidewall of the trench 11. Therefore, while the conductive portion 40 can repel surface electrons, the first conductive layer 41 cannot be overlarge.

Figure 8:
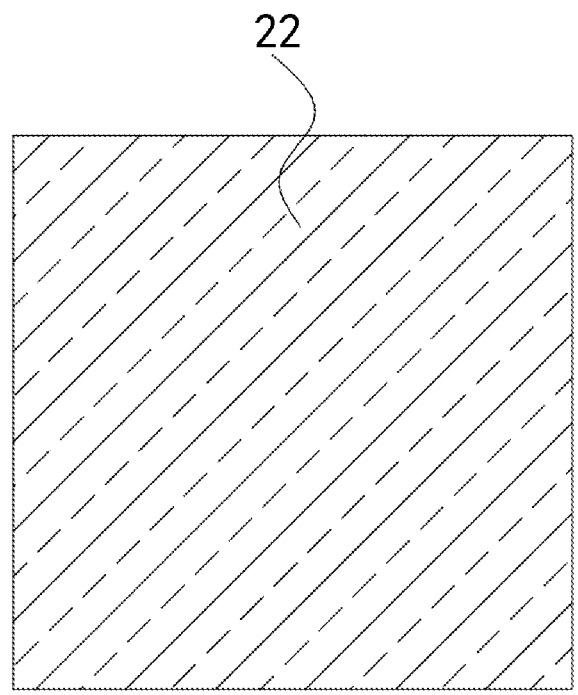
FIG. 8 is a top view of a first insulating layer formed in a method of manufacturing a semiconductor structure according to an exemplary implementation.
Figure 9:
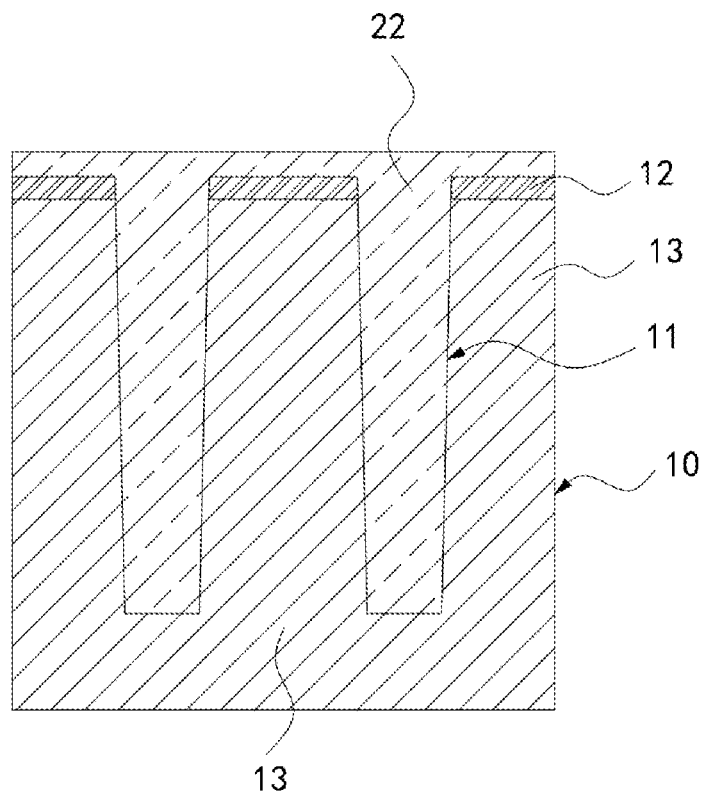
FIG. 9 is a schematic sectional view of a first insulating layer formed in a method of manufacturing a semiconductor structure according to an exemplary implementation.

In some embodiments, the first insulating layer 22 is formed in the trench 11, the first insulating layer 22 filling up the trench 11 and covering the insulating layer 12, as shown in FIG. 8 and FIG. 9. The first insulating layer 22 may be nitride or silicon oxide. The first insulating layer 22 may be formed with the PVD, the CVD or the ALD.

Figure 10:
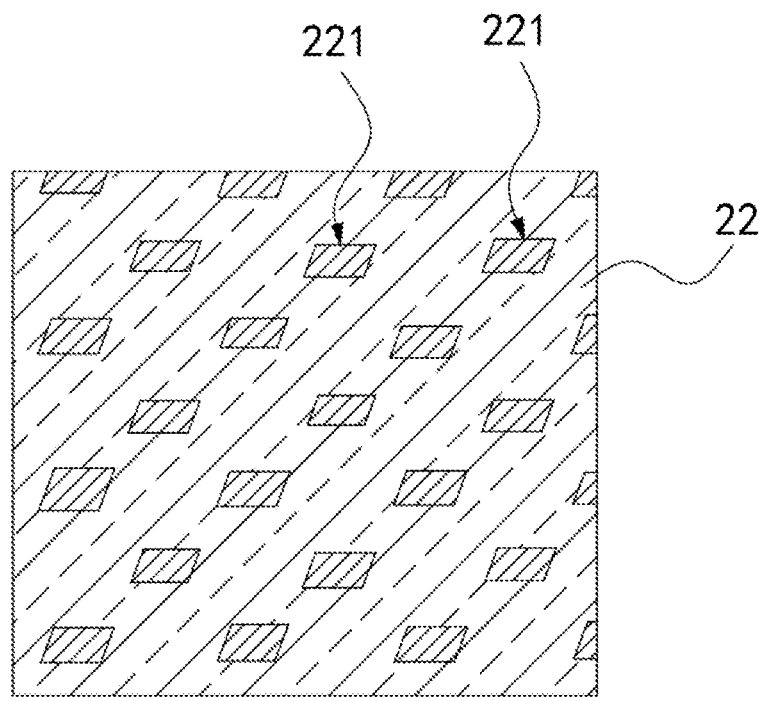
FIG. 10 is a top view of an opening formed in a method of manufacturing a semiconductor structure according to an exemplary implementation.
Figure 11:
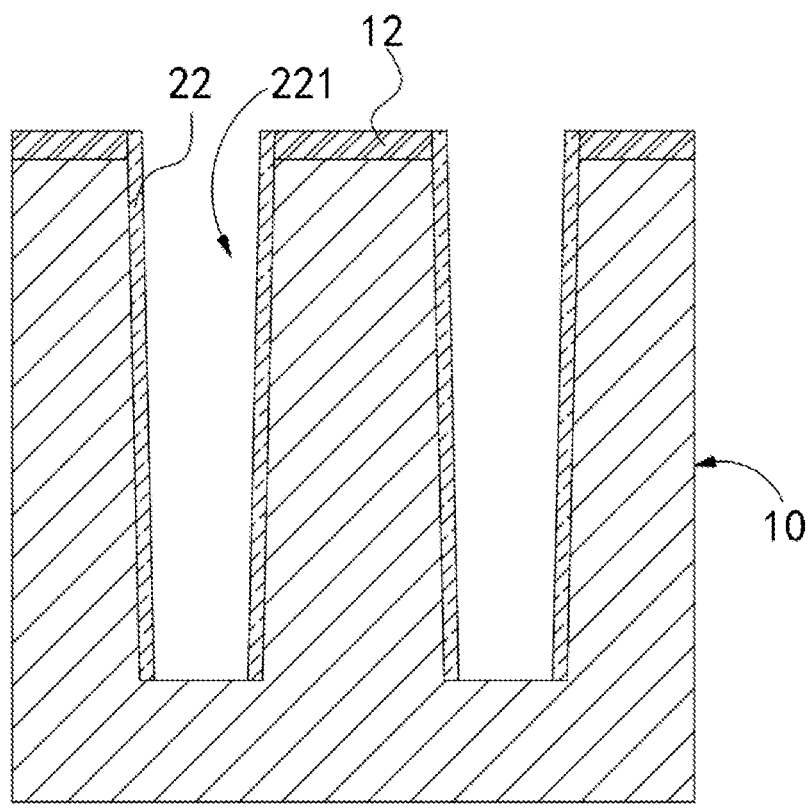
FIG. 11 is a schematic sectional view of an opening formed in a method of manufacturing a semiconductor structure according to an exemplary implementation.

An opening 221 is formed in the first insulating layer 22, and the opening 221 exposes the substrate 10, namely the first insulating layer 22 covers a sidewall of the opening 221, as shown in FIG. 10 and FIG. 11. In some embodiments, there remains a part of the first insulating layer 22 on the insulating layer 12, as shown in FIG. 10. In some embodiments, the first insulating layer 22 on the insulating layer 12 can be removed completely, as shown in FIG. 11. The opening 221 may be etched. The opening 221 serves as a part of the trench 11.

In an embodiment, polycrystalline silicon 411 is deposited in the trench 11 to form the first conductive layer 41, namely the polycrystalline silicon 411 serves as the conductive portion 40 to repel the neighboring electrons.

Figure 12A:
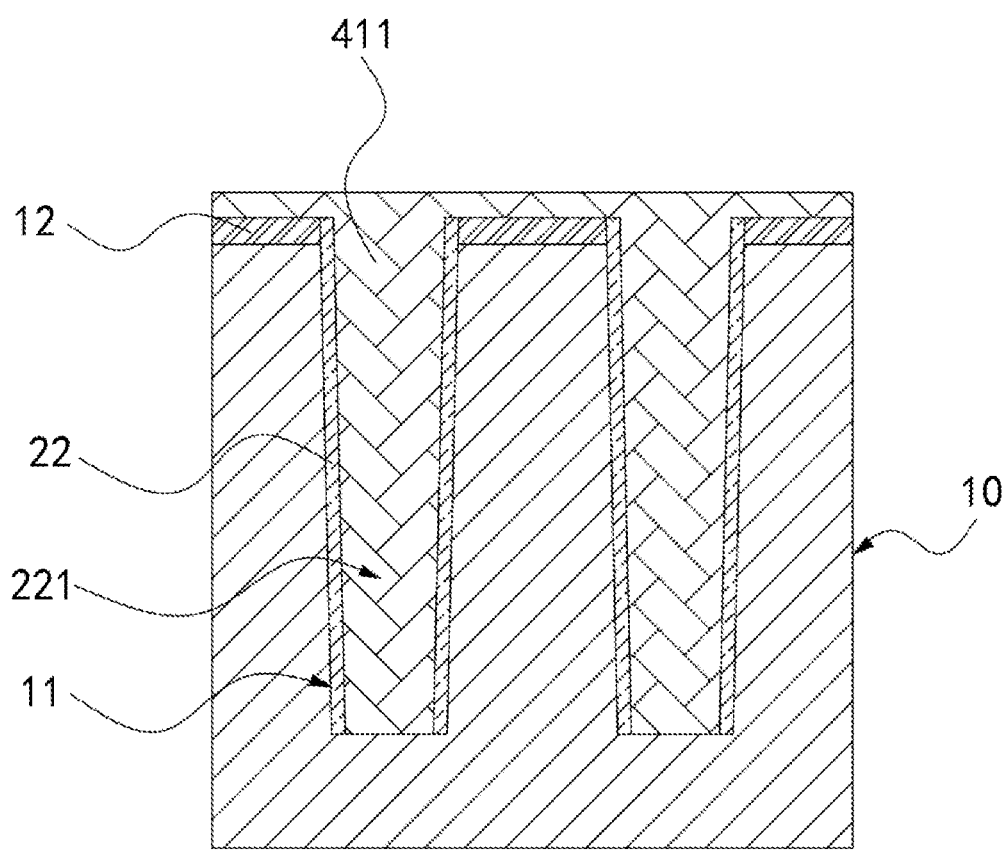
FIG. 12A is a schematic sectional view of polycrystalline silicon formed in a method of manufacturing a semiconductor structure according to an exemplary implementation.

In some embodiments, polycrystalline silicon 411 is deposited in the opening 221, the polycrystalline silicon 411 filling up the opening 221 and covering the insulating layer 12, as shown in FIG. 12A. The polycrystalline silicon 411 on the insulating layer 12 and a part of the polycrystalline silicon 411 in the opening 221 are removed by etching. The remaining polycrystalline silicon 411 is 20-30 nm high to serve as the conductive portion 40.

In an embodiment, the step of forming a conductive portion 40 includes: Form a second conductive layer 42 on the substrate 10 through the trench 11; and form a first conductive layer 41 on an upper surface of the second conductive layer 42, the first conductive layer 41 and the second conductive layer 42 serving as the conductive portion 40. The first conductive layer 41 is formed in the trench 11, and a first insulating layer 22 is formed between the first conductive layer 41 and a sidewall of the trench 11. The first conductive layer 41 is electrically connected to the substrate 10 through the second conductive layer 42, such that both the conductive portion 40 and the substrate 10 have the negative voltage, and can repel the neighboring electrons, thereby preventing the conduction of electrons at two sides of the isolation structure 20 and blocking the leakage path.

In an embodiment, a first metal material 421 is deposited in the substrate 10 and thermally treated to form metal silicide, the metal silicide serving as the second conductive layer 42. A second metal material 412 is formed on the metal silicide, the second metal material 412 serving as the first conductive layer 41. The first conductive layer 41 and the second conductive layer 42 are separately formed by the first metal material 421 and the second metal material 412, and are connected to each other to repel the neighboring electrons, thereby preventing the conduction of electrons at two sides of the isolation structure 20 and blocking the leakage path.

Figure 12B:
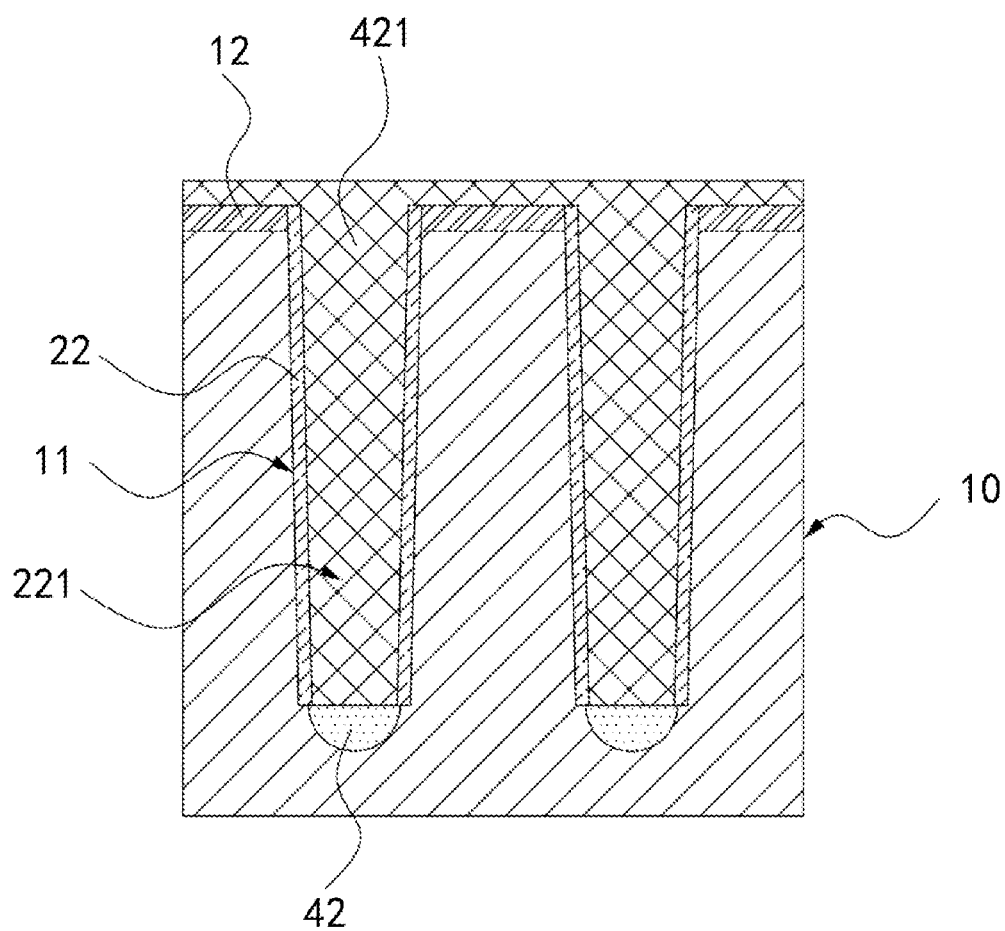
FIG. 12B is a schematic sectional view of a first metal material formed in a method of manufacturing a semiconductor structure according to an exemplary implementation.

In some embodiments, upon formation of the opening 221 in the first insulating layer 22, a first metal material 421 is deposited in the opening 221. The first metal material 421 fills up the opening 221, and covers the insulating layer 12. After thermally treated, the first metal material 421 reacts with the substrate 10 to form the metal silicide. The metal silicide serves as the second conductive layer 42, as shown in FIG. 12B. The thermal treatment may be performed at 340-450° C.

Figure 13:
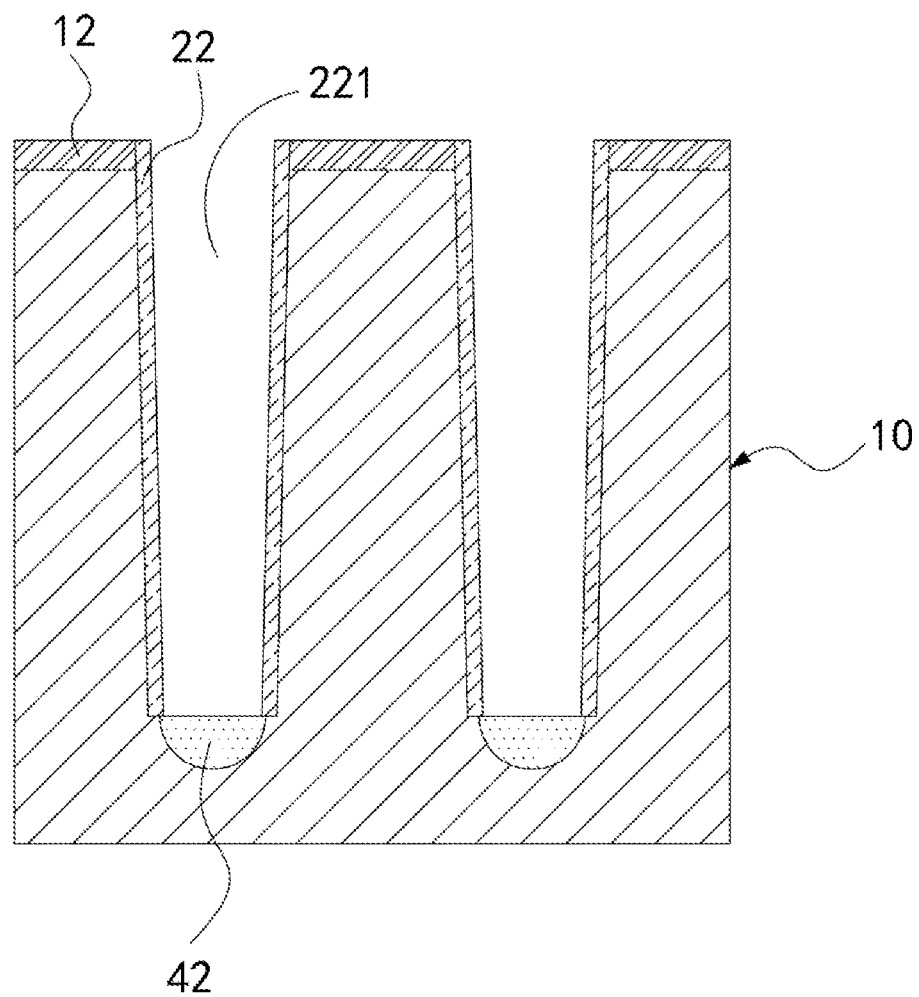
FIG. 13 is a schematic sectional view of a second conductive layer formed in a method of manufacturing a semiconductor structure according to an exemplary implementation.

The first metal material 421 contacting the substrate 10 and a part of the metal silicide are removed with wet etching to expose the second conductive layer 42, as shown in FIG. 13. The remaining metal silicide may be 10-20 nm high, namely the second conductive layer 42 may be 10-20 nm high.

In an embodiment, before formation of the first conductive layer 41, a third metal material 422 is formed on a wall of the first insulating layer 22. The first conductive layer 41 is formed in the third metal material 422. The third metal material 422 protects the first conductive layer 41.

Figure 14:
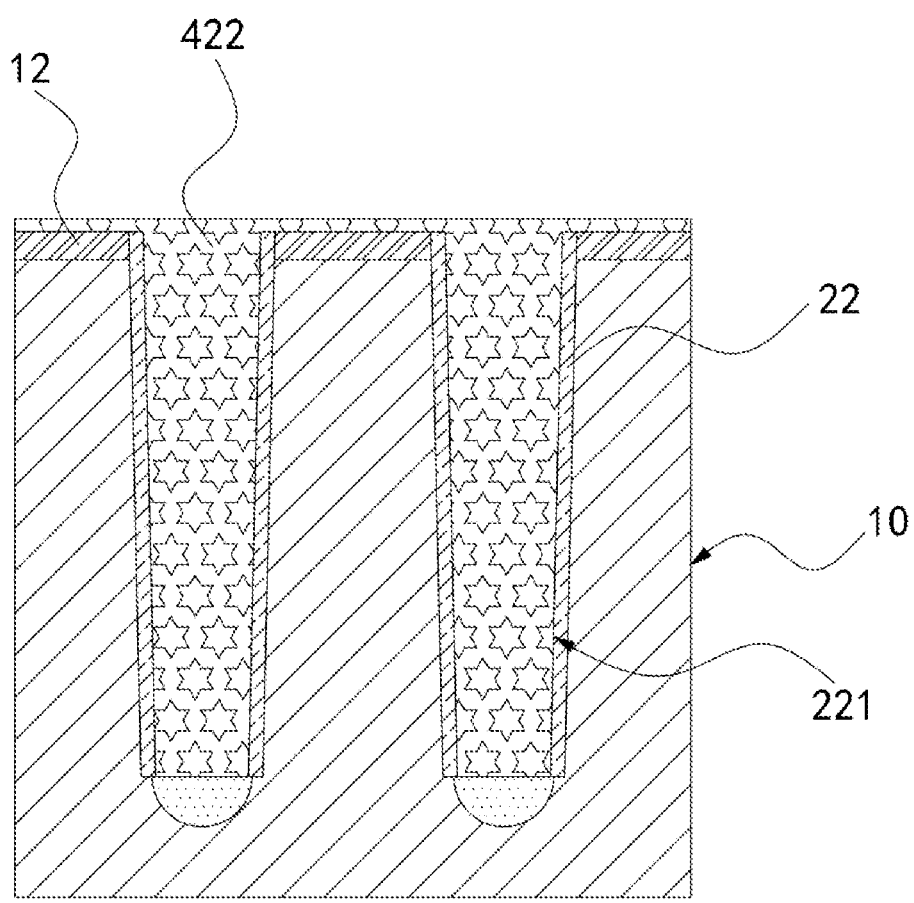
FIG. 14 is a schematic sectional view of a third metal material formed in a method of manufacturing a semiconductor structure according to an exemplary implementation.

The third metal material 422 is deposited in the opening 221. The third metal material 422 fills up the opening 221, covers the insulating layer 12, and contacts the second conductive layer 42, as shown in FIG. 14. The second metal material 412 may be tungsten. The third metal material 422 may be metal nitride, such as the third metal material 422 may be titanium nitride.

Figure 15:
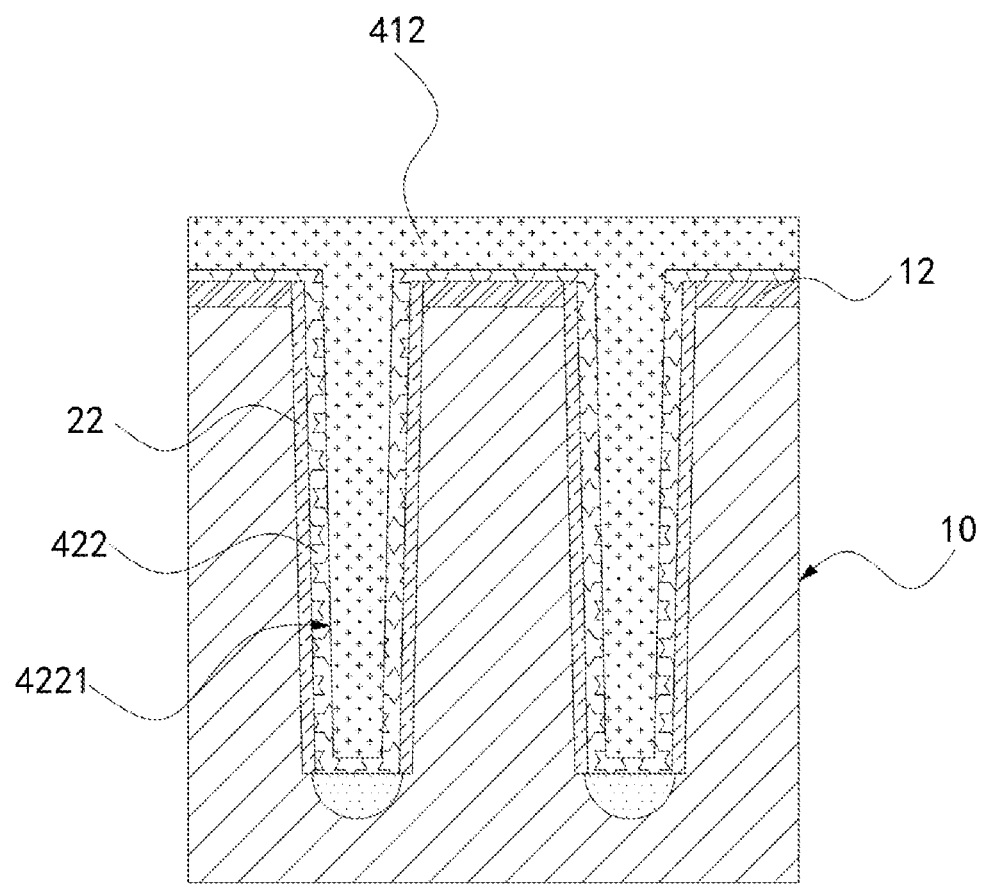
FIG. 15 is a schematic sectional view of a second metal material formed in a method of manufacturing a semiconductor structure according to an exemplary implementation.

A recess 4221 is formed in the third metal material 422, and the second metal material 412 is deposited in the recess 4221. The second metal material 412 fills up the recess 4221, and covers an upper surface of the third metal material 422, as shown in FIG. 15.

Figure 16:
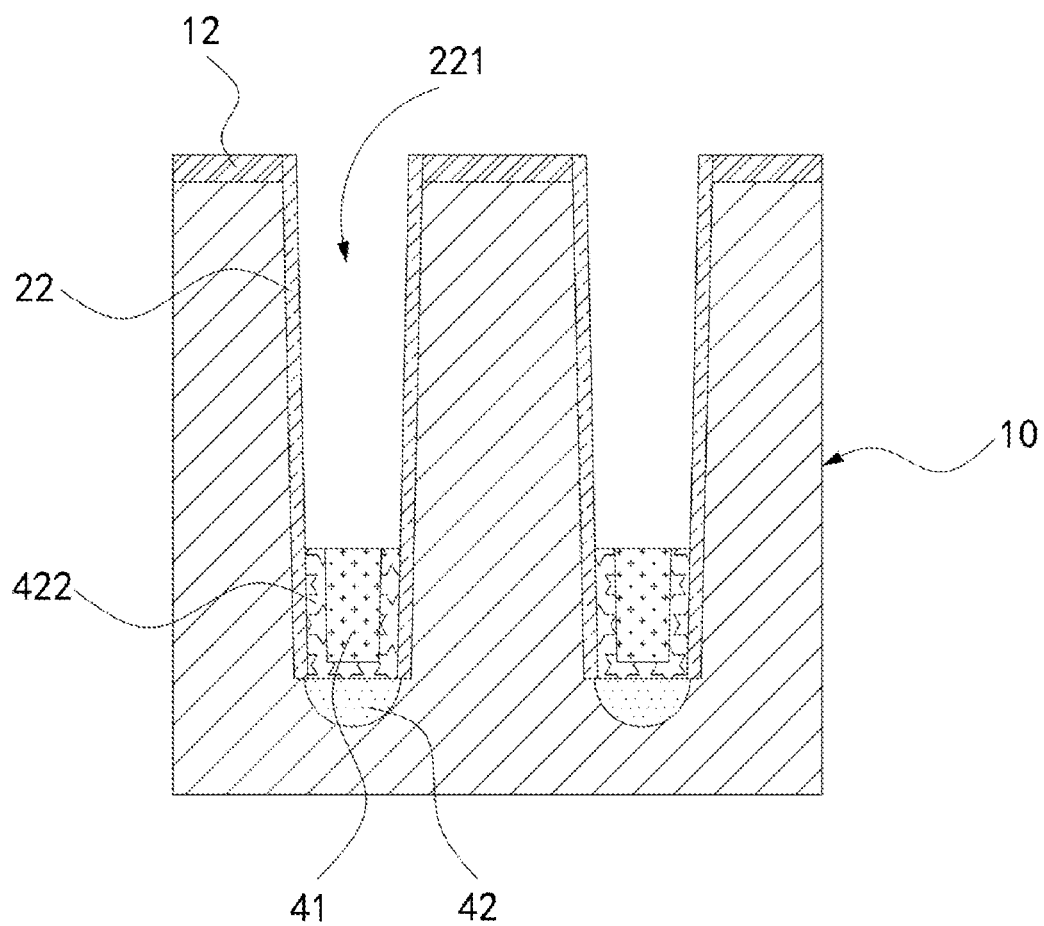
FIG. 16 is a schematic sectional view of a first conductive layer formed in a method of manufacturing a semiconductor structure according to an exemplary implementation.

The second metal material 412 and the third metal material 422 are etched. There remains a part of the second metal material 412 and a part of the third metal material 422 in the opening 221. The remaining second metal material 412 serves as the first conductive layer 41, and the first conductive layer 41 is located in the remaining third metal material 422, as shown in FIG. 16. The remaining second metal material 412 may be 20-30 nm high.

In some embodiments, the conductive portion 40 may include the metal silicide formed by the first metal material 421 and the substrate 10, the second metal material 412 and the third metal material 422.

In an embodiment, the WL trench 21 is formed in the isolation structure 20 and in the active region 13. The WL 30 is formed in the WL trench 21 of each of the isolation structure 20 and the active region 13.

Figure 17:
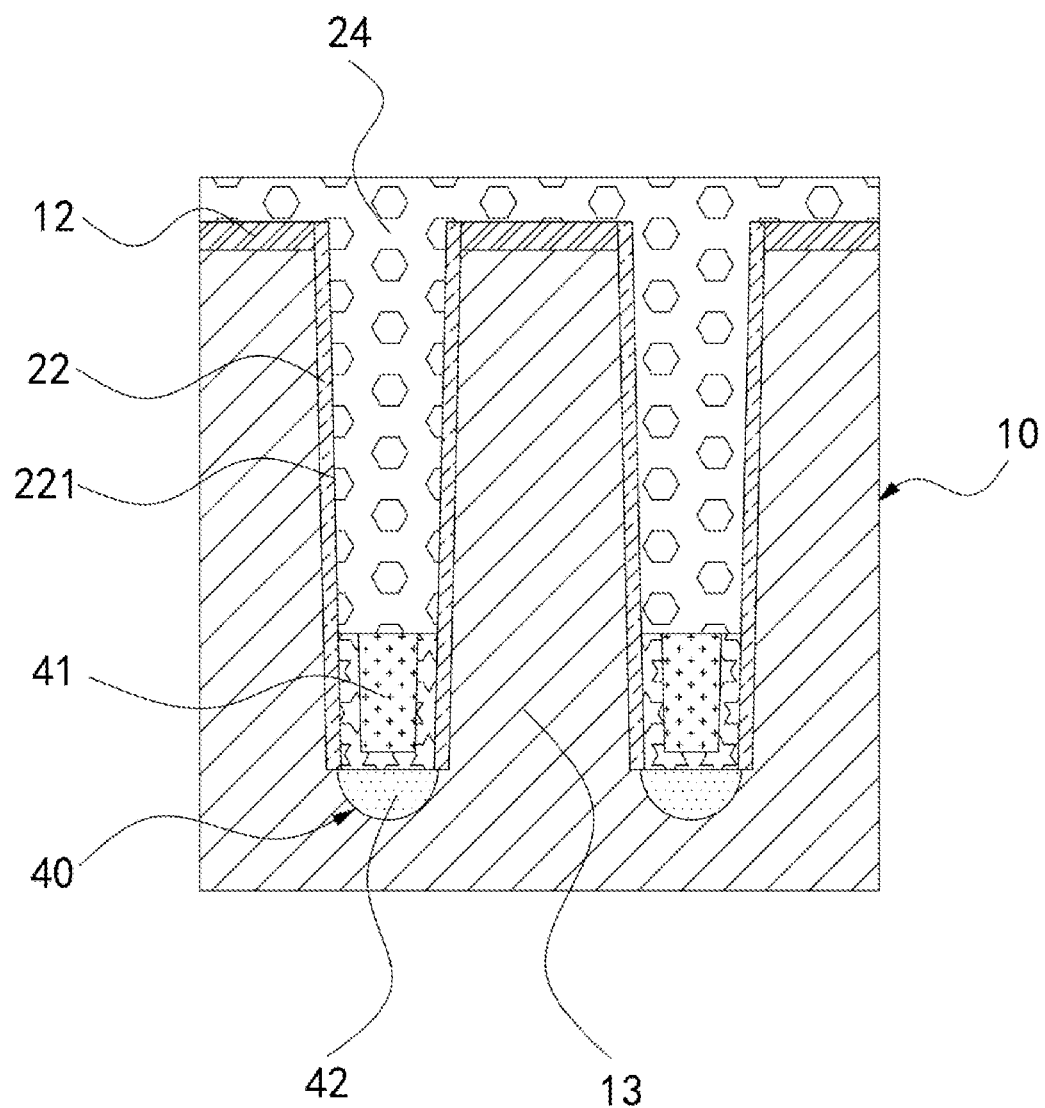
FIG. 17 is a schematic sectional view of a second insulating layer formed in a method of manufacturing a semiconductor structure according to an exemplary implementation.

In an embodiment, upon formation of the conductive portion 40, there remains a part of the opening 221 on the conductive portion 40, as shown in FIG. 16. A second insulating layer 24 is formed in the opening 221. The second insulating layer 24 fills the exposed opening 221, and covers the insulating layer 12, as shown in FIG. 17.

A plurality of the WL trenches 21 are formed in the second insulating layer 24 and the active region 13. The WL 30 is formed in the WL trench 21.

In an embodiment, a part of the second insulating layer 24 is removed to expose the opening 221 in the second insulating layer 24, namely the exposed opening 221 serves as the WL trench 21 in the isolation structure 20. The WL trench 21 is also formed in the active region 13. The first insulating layer 22 and the second insulating layer 24 may serve as the isolation structure 20.

Figure 18:
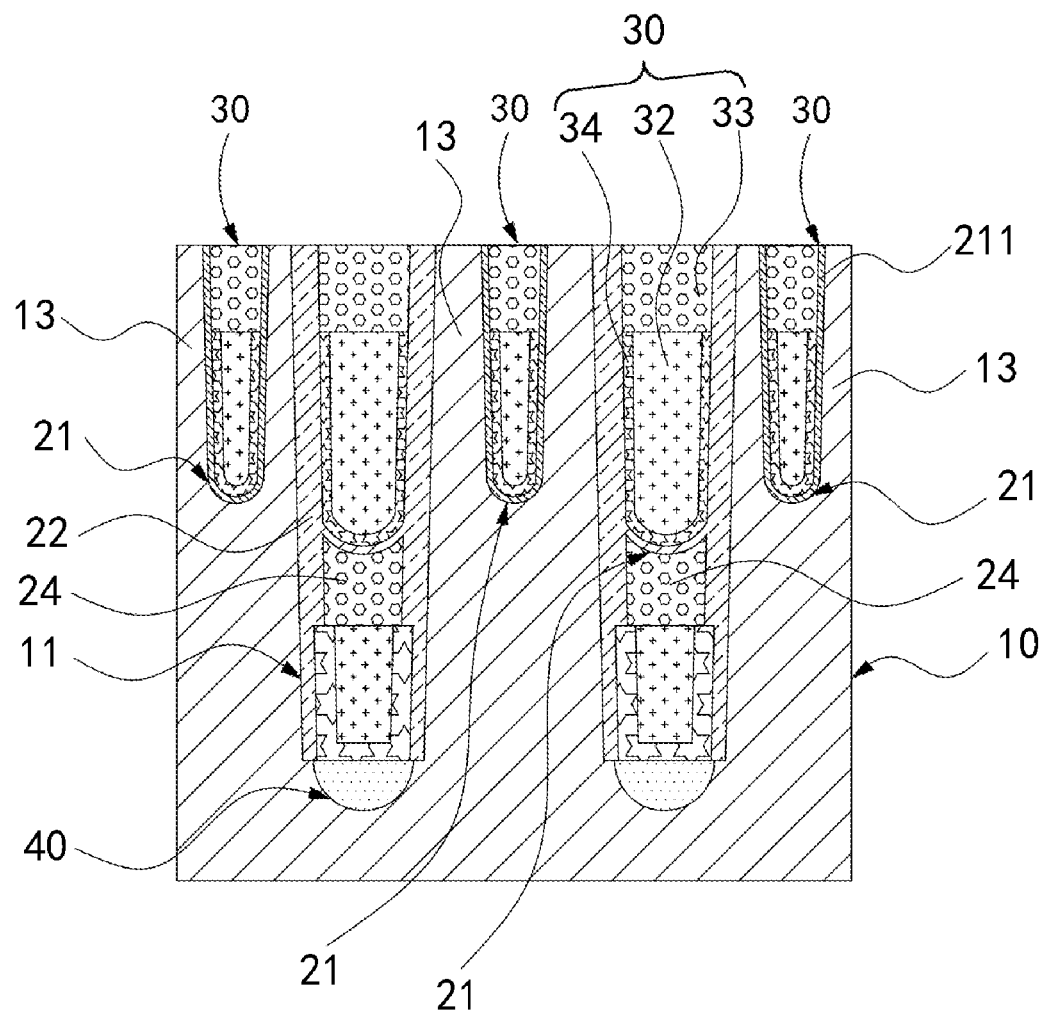
FIG. 18 is a schematic sectional view of a WL formed in a method of manufacturing a semiconductor structure according to an exemplary implementation.

The WL 30 may include a barrier layer 34, a conductive layer 32 and a third insulating layer 33. The barrier layer 34 covers a wall of the WL trench 21. The conductive layer 32 is located in the barrier layer 34. The third insulating layer 33 covers the barrier layer 34 and the conductive layer 32, as shown in FIG. 18.

After the barrier layer 34 is deposited in the WL trench 21, the barrier layer 34 fills up the WL trench 21, and is etched to make a remaining part of the barrier layer 34 cover the wall of the WL trench 21. The conductive layer 32 is filled in the barrier layer 34. The conductive layer 32 is etched, such that an upper surface of the conductive layer 32 is flush with an upper surface of the barrier layer 34. The third insulating layer 33 is formed at last.

In an embodiment, the barrier layer 34 may include Ta, Ti, Ru, TaN, TiN, RuTa, RuTaN, W or Ir. The barrier layer 34 may be formed by any material capable of preventing diffusion of the conductive material layer. In an embodiment, the conductive layer 32 may be formed by a metal material such as Cu, Al, W or alloy. In an embodiment, the third insulating layer 33 may be formed by a material including silicon oxide, silicon nitride or a combination thereof. For example, the third insulating layer 33 may be formed by SIN, SION or $SIO_2$.

In an embodiment, upon formation of the WL trench 21, a fourth insulating layer 211 is formed on a sidewall of the WL trench 21. The WL 30 is formed in the fourth insulating layer 211. The fourth insulating layer 211 may be formed by a material including silicon oxide, silicon nitride or a combination thereof. For example, the fourth insulating layer 211 may be formed by SIN, SION or $SIO_2$.

It is to be noted that when the first conductive layer 41 serves as the conductive portion 40, after the polycrystalline silicon 411 shown in FIG. 12A is formed, the second insulating layer 24 is formed on the polycrystalline silicon 411, the WL trench 21 is formed in each of the isolation structure 20 and the active region 13, and the WL 30 is formed in the WL trench 21 in each of the isolation structure 20 and the active region 13. The specific structure and process may refer to those when the first conductive layer 41 and the second conductive layer 42 serves as the conductive portion 40.

In an embodiment, the method of manufacturing a semiconductor structure further includes: Form a first contact plug 50 and a second contact plug 51 at two sides of the WL 30. Both the first contact plug 50 and the second contact plug 51 are a capacitance contact plug. The first contact plug 50 and the second contact plug 51 are configured to connect two capacitor structures. When the WL 30 is activated, the first contact plug 50 and the second contact plug 51 are connected to the electrons at two sides of the isolation structure 20. While the electrons at two sides of the isolation structure 20 are connected, the first contact plug 50 and the second contact plug 51 are also connected to cause the electric leakage between the two capacitor structures. In the embodiment, since the conductive portion 40 is formed at the bottom of the isolation structure 20 and the conductive portion 40 repels the neighboring electrons, the conduction of electrons at two sides of the isolation structure 20 can be blocked to prevent the electric leakage between the two capacitor structures.

The semiconductor structure formed with the method is provided with the conductive portion 40 at the bottom of the isolation structure 20. The conductive portion 40 can repel the electrons, thereby reducing the current leakage of the semiconductor structure and improving the performance of the semiconductor structure. The semiconductor structure is applied to the DRAM device with the small size and the high performance.

It should be noted that the semiconductor structure in the embodiment is obtained through the method of manufacturing a semiconductor structure. For other materials and structures of the semiconductor structure in the embodiment, reference may be made to the method of manufacturing a semiconductor structure.

Those skilled in the art may easily figure out other implementations of the present disclosure after considering the specification and practicing the invention disclosed herein. The present disclosure is intended to cover any variations, purposes, or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures described above and shown in the drawings, and can be modified and changed in many ways without departing from the scope of the present disclosure. The scope of the present disclosure is defined by the appended claims.

The invention claimed is:

1. A semiconductor structure, comprising:
a substrate;
an isolation structure, formed in the substrate;
a word line, a part of the word line being located in the isolation structure; and
a conductive portion, located at a bottom of the isolation structure;
wherein the conductive portion is in electrical contact with the substrate.

2. The semiconductor structure according to claim 1, wherein a voltage of the conductive portion and a voltage of the substrate are a negative voltage.

3. The semiconductor structure according to claim 1, wherein the conductive portion comprises:
a first conductive layer, a part of the first conductive layer being located in the isolation structure.

4. The semiconductor structure according to claim 3, wherein the first conductive layer contacts the substrate; and
a material of the first conductive layer comprises polycrystalline silicon.

5. The semiconductor structure according to claim 3, wherein the conductive portion further comprises:
a second conductive layer, contacting the substrate, the first conductive layer being located on an upper surface of the second conductive layer.

6. The semiconductor structure according to claim 5, wherein a material of the first conductive layer comprises a metal material, while a material of the second conductive layer comprises metal silicide.

7. The semiconductor structure according to claim 5, wherein a bottom of the first conductive layer is located in the second conductive layer.

8. The semiconductor structure according to claim 1, wherein the word line is a buried word line.

9. The semiconductor structure according to claim 1, wherein the isolation structure is a shallow trench isolation structure.

10. The semiconductor structure according to claim 1, further comprising:
a first contact plug; and
a second contact plug, wherein the first contact plug and the second contact plug are located at two sides of the word line; and
both the first contact plug and the second contact plug are a capacitance contact plug.

11. The semiconductor structure according to claim 1, wherein the conductive portion is located below the word line, and insulated from the word line.

12. The semiconductor structure according to claim 11, wherein a height of the conductive portion is less than a distance between the conductive portion and the word line.

13. A method of manufacturing a semiconductor structure, comprising:
providing a substrate;
forming a trench in the substrate;
forming an isolation structure in the trench, and forming a conductive portion at a bottom of the isolation structure;
forming a word line trench in the isolation structure; and
forming a word line in the word line trench;
wherein the conductive portion is in electrical contact with the substrate.

14. The method of manufacturing the semiconductor structure according to claim 13, wherein the forming a conductive portion comprises:
forming a first conductive layer in the trench, the first conductive layer serving as the conductive portion, wherein
a first insulating layer is formed between the first conductive layer and a sidewall of the trench.

15. The method of manufacturing the semiconductor structure according to claim 14, wherein polycrystalline silicon is deposited in the trench to form the first conductive layer.

16. The method of manufacturing the semiconductor structure according to claim 13, wherein the forming a conductive portion comprises:
forming a second conductive layer on the substrate through the trench; and
forming a first conductive layer on an upper surface of the second conductive layer, the first conductive layer and the second conductive layer serving as the conductive portion,
wherein the first conductive layer is formed in the trench, and a first insulating layer is formed between the first conductive layer and a sidewall of the trench.

17. The method of manufacturing the semiconductor structure according to claim 16, wherein a first metal material is deposited in the substrate and thermally treated to form metal silicide, the metal silicide serving as the second conductive layer; and
a second metal material is formed on the metal silicide, the second metal material serving as the first conductive layer.

18. The method of manufacturing the semiconductor structure according to claim 16, before the forming a first conductive layer, further comprising: forming a third metal material on a wall of the first insulating layer, wherein
the first conductive layer is formed in the third metal material.

19. The method of manufacturing the semiconductor structure according to claim 14, wherein the substrate is provided with a plurality of active regions, and the isolation structure is provided between the active regions;
the word line trench is also formed in each of the active regions, and a part of the word line is formed in the word line trench in each of the active regions; and
before the word line is formed, a second insulating layer is formed on the first conductive layer to insulate and isolate the word line and the first conductive layer.

* * * * *